US011545799B2

(12) United States Patent
Lee et al.

(10) Patent No.: US 11,545,799 B2
(45) Date of Patent: Jan. 3, 2023

(54) UNINTERRUPTIBLE VIDEO SPLITTER

(71) Applicant: CABLE VISION ELECTRONICS CO., LTD, New Taipei (TW)

(72) Inventors: Chien-Chung Lee, New Taipei (TW); I-Sheng Ting, New Taipei (TW)

(73) Assignee: CABLE VISION ELECTRONICS CO., LTD, New Taipei (TW)

( * ) Notice: Subject to any disclaimer, the term of this patent is extended or adjusted under 35 U.S.C. 154(b) by 324 days.

(21) Appl. No.: 16/775,272

(22) Filed: Jan. 29, 2020

(65) Prior Publication Data
US 2021/0135415 A1 May 6, 2021

(30) Foreign Application Priority Data

Nov. 4, 2019 (TW) .................................. 108214585

(51) Int. Cl.
*H01R 13/02* (2006.01)
*H01R 13/646* (2011.01)
*H05K 5/00* (2006.01)
*H05K 5/02* (2006.01)
*H01R 31/02* (2006.01)

(52) U.S. Cl.
CPC ........... *H01R 31/02* (2013.01); *H01R 13/646* (2013.01); *H05K 5/0047* (2013.01); *H05K 5/0069* (2013.01); *H05K 5/0247* (2013.01)

(58) Field of Classification Search
CPC .... H01R 31/02; H01R 13/646; H05K 5/0047; H05K 5/0069; H05K 5/0247; H04N 7/104
See application file for complete search history.

(56) References Cited

U.S. PATENT DOCUMENTS

| 5,648,745 | A | * | 7/1997 | Spriester | ................ | H01R 24/52 |
| | | | | | | 439/189 |
| 5,677,578 | A | * | 10/1997 | Tang | ..................... | H01R 13/701 |
| | | | | | | 307/119 |
| 5,756,935 | A | * | 5/1998 | Balanovsky | ......... | H01R 24/547 |
| | | | | | | 200/51.09 |
| 5,909,154 | A | * | 6/1999 | Brown | ..................... | H04N 7/104 |
| | | | | | | 333/100 |
| 6,593,830 | B2 | * | 7/2003 | Wu | ......................... | H01R 24/46 |
| | | | | | | 725/127 |
| 2003/0192063 | A1 | * | 10/2003 | Runkle | ................... | H04N 7/104 |
| | | | | | | 725/127 |

(Continued)

*Primary Examiner* — Oscar C Jimenez
*Assistant Examiner* — Paul D Baillargeon
(74) *Attorney, Agent, or Firm* — Chun-Ming Shih; HDLS IPR Services

(57) ABSTRACT

A video splitter includes a housing. The housing has a seat shell and a cover shell. A pair of main signal ports is provided in the seat shell. At least part of the main signal ports is out of contact with the seat shell. A pair of pushing rods is provided in the housing. The seat shell has an insulative element, a pair of elastic beam terminals and a conductive element. The conductive element connects with the elastic beam terminals. Each of the elastic beam terminals is separately and movably arranged between one of the main signal ports and the seat shell. The seat shell has ferrite elements. A splitter board is disposed in the cover shell. The splitter board has a pair of first terminals correspondingly connecting with second terminals in the main signal ports. Splitting signal ports electrically connecting with the splitter board are provided outside the cover shell.

9 Claims, 4 Drawing Sheets

(56) References Cited

U.S. PATENT DOCUMENTS

| | | | | |
|---|---|---|---|---|
| 2011/0095840 A1* | 4/2011 | Degtyarev | ............. | H03H 7/383 |
| | | | | 333/32 |
| 2015/0206147 A1* | 7/2015 | Stanfield | ................ | G06Q 20/24 |
| | | | | 705/41 |
| 2016/0113140 A1* | 4/2016 | Chang | .................... | H04N 7/104 |
| | | | | 361/679.01 |
| 2021/0337165 A1* | 10/2021 | Lee | ........................ | H04N 7/108 |

* cited by examiner

UNINTERRUPTIBLE VIDEO SPLITTER

BACKGROUND OF THE INVENTION

Technical Field

The invention relates to video splitters, particularly to a video splitter which is uninterruptible when being maintained or disassembled.

Related Art

Current cable TV signal splitters are installed on a main signal cable. The signals are input into a signal splitter via an input port and are sent back to the main signal cable via an output port. The signal is also split by the signal splitter to be output through splitting taps on the signal splitter. When the signal splitter is being repaired, both the splitting taps connected between the input port and the output port of the main signal cable and a main circuit board must be removed. To prevent an interruption of the signal transmission on the main signal cable, an elastic beam connecting sheet is provided between the input port and the output port. When the splitting tap is removed, the elastic beam connecting sheet will connect the input port and the output port to continue the signal transmission. When the splitting tap has been reconnected between the input port and the output port, the elastic beam connecting sheet can detach from the input port and output port to allow signals to pass the splitting tap.

The elastic beam connecting sheet solves the problem of signal interruption during repairs, but electromagnetic induction between the elastic beam connecting sheet and electronic components or wiring in the splitter affects the quality of high frequency signal transmission.

SUMMARY OF THE INVENTION

The invention provides a video splitter which is uninterruptible when being maintained or disassembled.

The invention provides an uninterruptible video splitter which includes a housing having a seat shell and a cover shell hermetically combining with the seat shell. A pair of main signal ports is provided in the seat shell. At least part of the main signal ports is out of contact with the seat shell. A pair of pushing rods is provided in the housing. An insulative element, a pair of elastic beam terminals and a conductive element are provided in the seat shell. The conductive element is disposed in the insulative element to isolate the housing. The conductive element connects with the pair of elastic beam terminals to make electric connection. Each of the pair of elastic beam terminals is movably arranged between one of the main signal ports and the seat shell. An internal surface of the seat shell is provided with ferrite elements corresponding to the respectively elastic beam terminals. A splitter board is disposed in the cover shell. The splitter board is provided with a pair of first terminals correspondingly connecting with second terminals in the main signal ports. Splitting signal ports electrically connecting with the splitter board are provided outside the cover shell. Each of the elastic beam terminals presses one of the main signal ports when the cover shell is removed from the seat shell, and the pushing rods push the elastic beam terminals away from the respective main signal ports to touch the ferrite elements when the cover shell is closed to seat shell.

In the uninterruptible video splitter of the invention, the pair of elastic beam terminals is disposed on the insulative element, each main signal port is formed with channels which are orthogonally connected with each other, and the seat shell is formed with wiring holes correspondingly communicating with the channels.

In the uninterruptible video splitter of the invention, the main signal port is embedded in the insulative element, and part of the main signal port is exposed for being pressed by the elastic beam terminal. The conductive element is embedded in the insulative element, and each of the elastic beam terminals extends from the conductive element to pass out of the insulative element. The elastic beam terminal and the conductive element are formed by a single metal sheet. Each of the elastic beam terminals is bent to be in the shape an S-shaped structure, a protrusion on a side of the S-shaped structure is used to connect a corresponding one of the main signal ports, and a protrusion on another side of the S-shaped structure is used to connect a corresponding one of the ferrite elements. Each of the pushing rods is disposed on the insulative element to be longitudinally movable and penetrates the insulative element.

In the uninterruptible video splitter of the invention, when the cover shell and the seat shell are closed, the splitter board presses the pushing rods to push the elastic beam terminals away from the main signal ports to touch the ferrite elements. The high frequency property of the splitter board will not be affected because the ferrite elements reduce the resonant frequency of the elastic beam terminals.

DETAILED DESCRIPTION OF THE INVENTION

Figure 1:
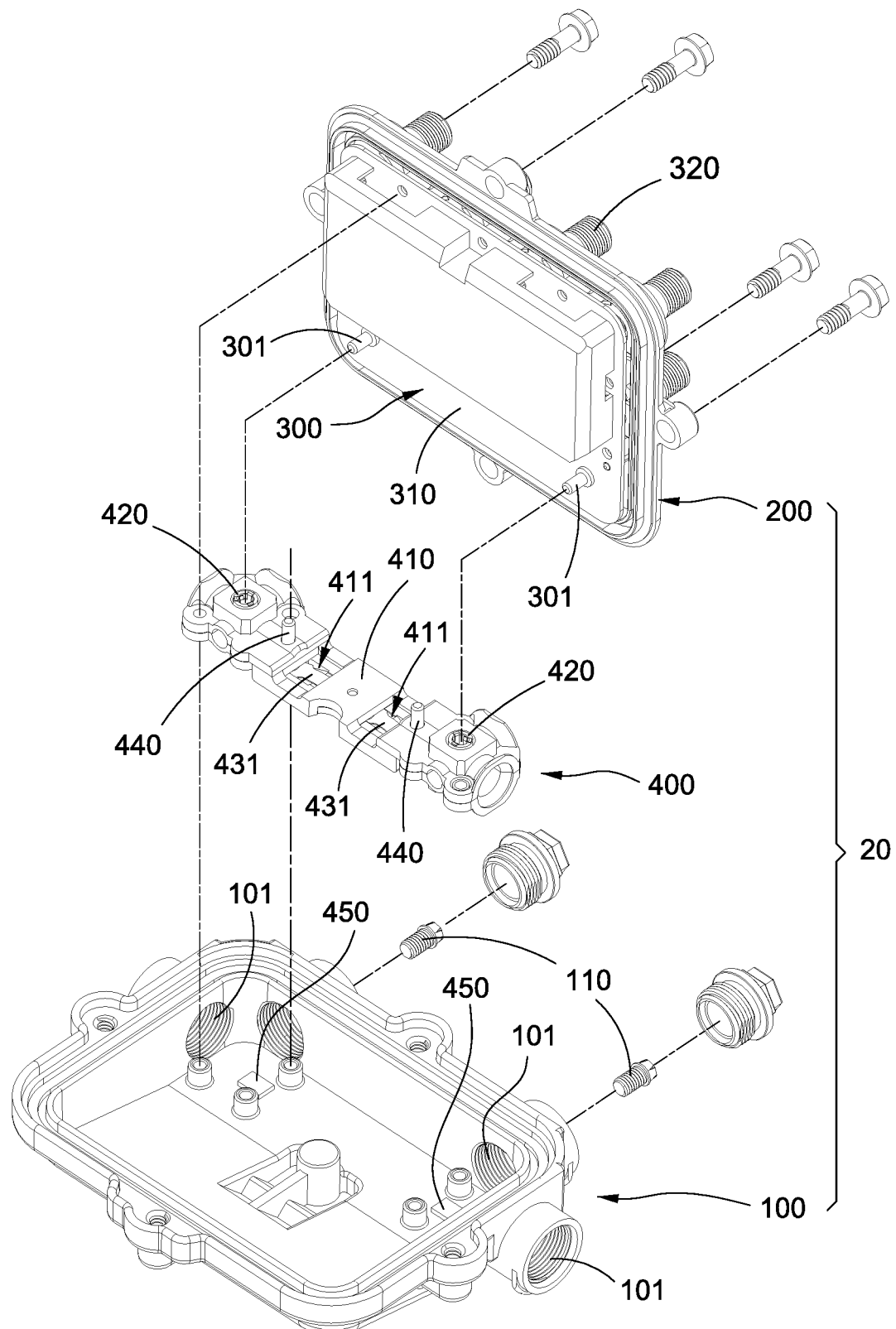
FIG. 1 is an exploded view of an uninterruptible video splitter of a preferred embodiment of the invention.
Figure 2:
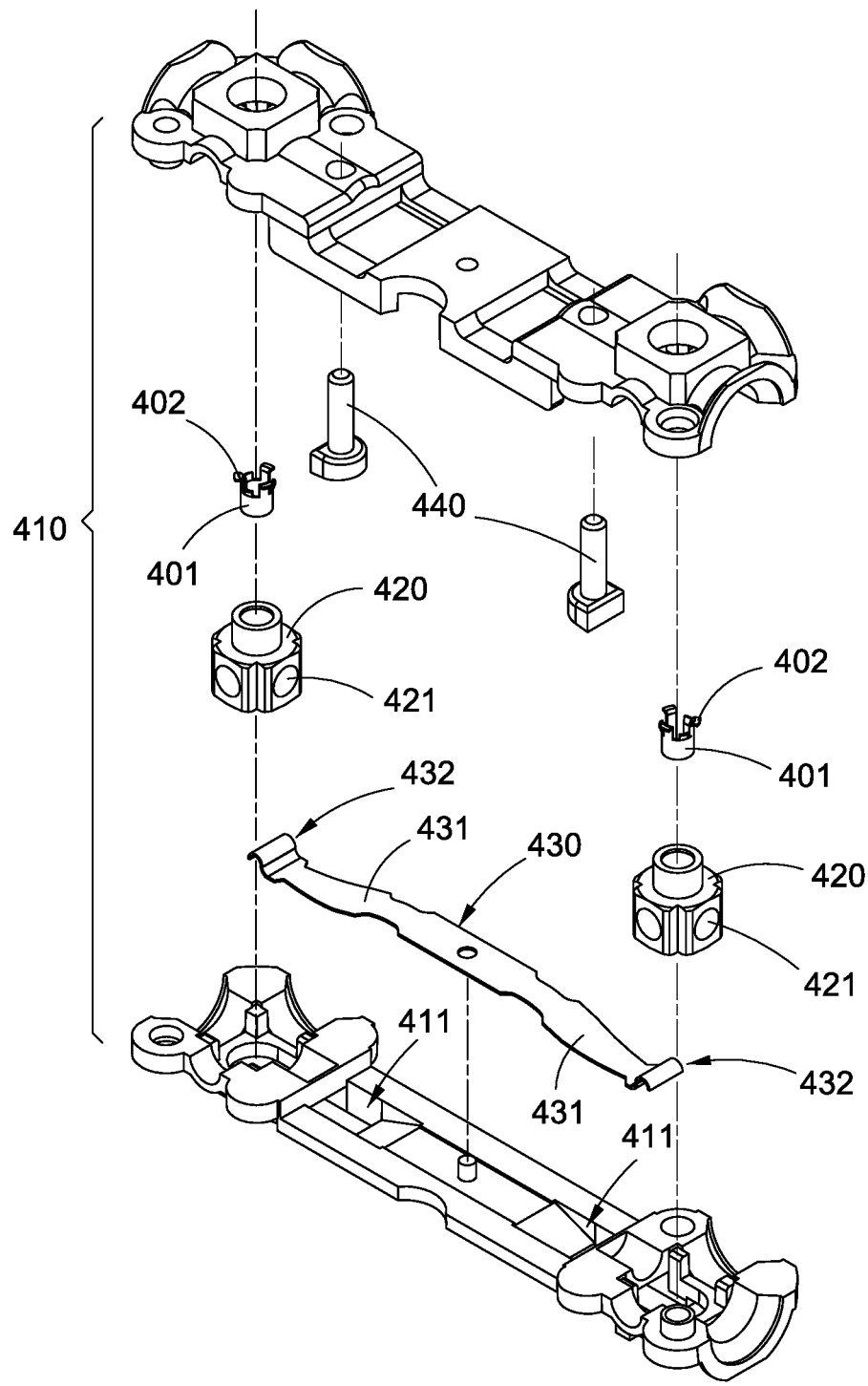
FIG. 2 is a schematic view of a switching assembly in the uninterruptible video splitter of a preferred embodiment of the invention.
Figure 3:
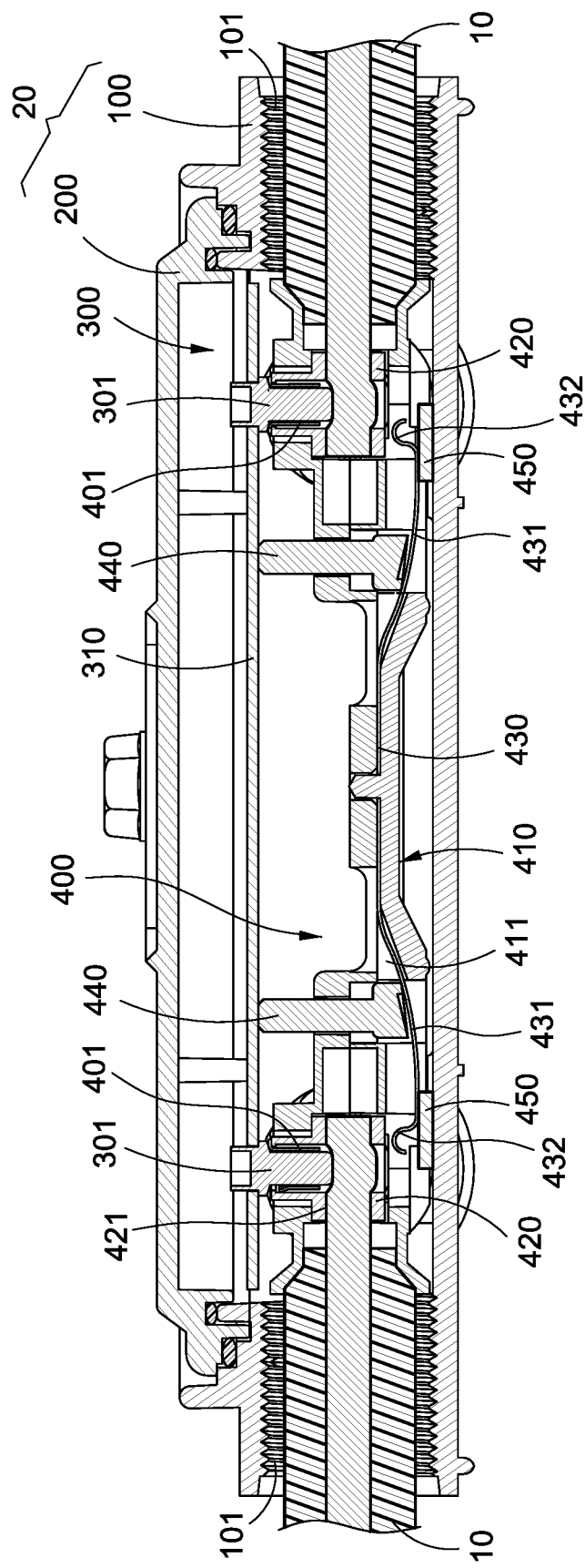
FIG. 3 is a schematic view of the uninterruptible video splitter of a preferred embodiment of the invention in a closed status.
Figure 4:
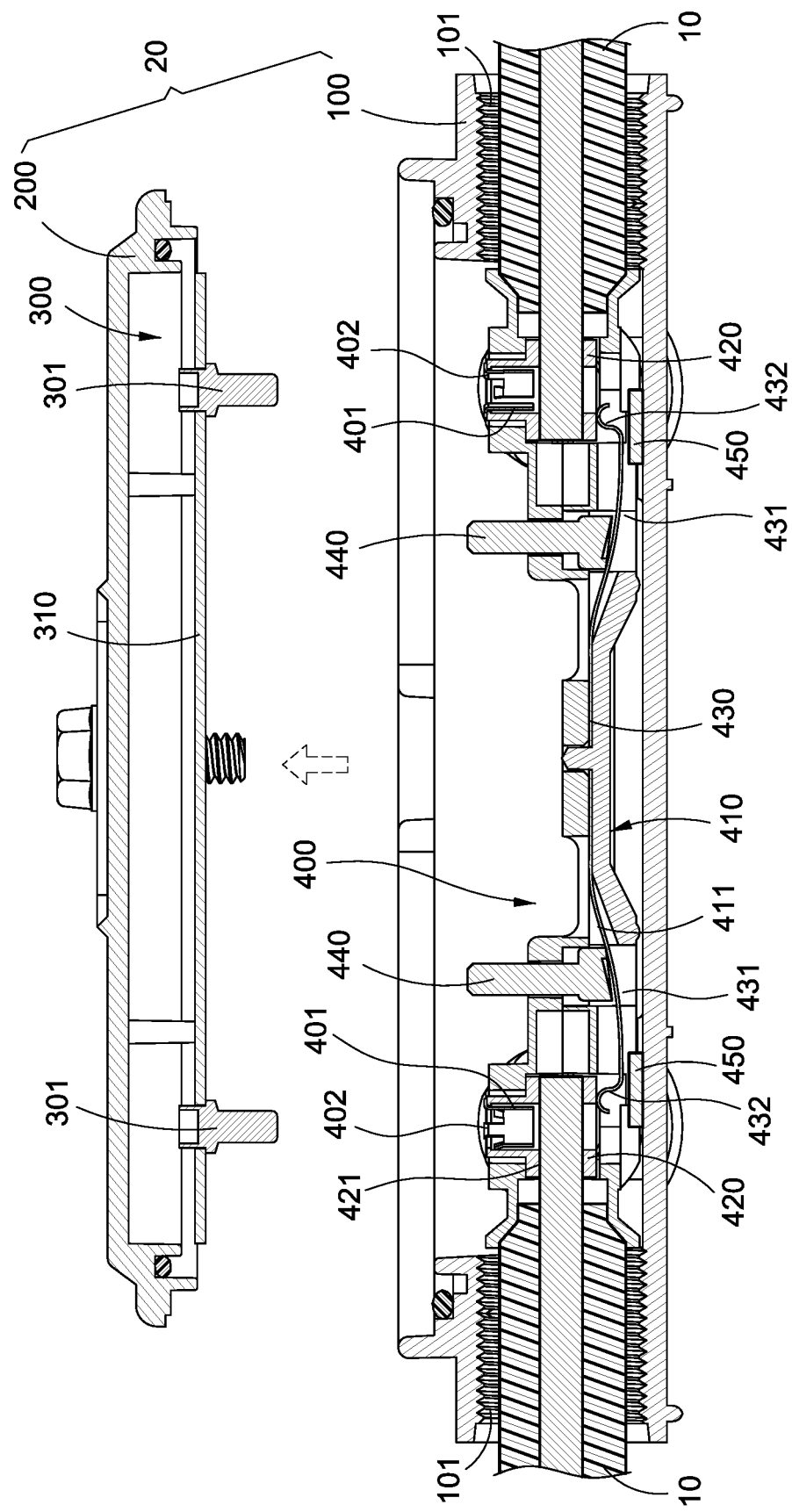
FIG. 4 is a schematic view of the uninterruptible video splitter of a preferred embodiment of the invention in an open status.

Please refer to FIGS. 1-4. A preferred embodiment of the invention provides an uninterruptible video splitter which includes a housing 20. The housing 20 includes a seat shell 100 and a cover shell 200 hermetically combining with the seat shell 100. The cover shell 200 covers and correspondingly connects with the seat shell 100. Both a splitter module 300 and a switching module 400 are received in the housing 20.

In this embodiment, the splitter module 300 is arranged in the cover shell 200 and includes a splitter board 310, a pair of first terminals 301 and splitting signal ports 320. The switching module 400 is arranged in the seat shell 100. Preferably, the switching module 400 in this embodiment includes an insulative element 410, a pair of main signal ports 420, a pair of elastic beam terminals 431 and pair of pushing rods 440.

Preferably, in this embodiment, the insulative element 410 is a set of closed shell and fixed in the seat shell 100, but not limited to this. At least part of each of the main signal ports 420 is out of contact with the seat shell 100. An internal surface of the seat shell 100 is provided with ferrite elements 450 corresponding to the respectively elastic beam terminals 431. Each elastic beam terminal 431 penetrates a gap between one of the main signal ports 420 and the seat shell 100 to be capable of moving between the main signal port 420 and the magnetic element 450. In this embodiment, the pair of main signal ports 420 is embedded in the insulative element 410 and is isolated with the seat shell 100 by the insulative element 410, but not limited to this. Each main signal port 420 may be partially isolated with the seat shell 100 and partially in contact with the seat shell 100 as grounding, for example, the main signal port 420 is extended with a pin to directly connect the seat shell 100. A part of each main signal port 420 is exposed and the exposed portion of each main signal port 420 is arranged toward the internal surface of the seat shell 100, but not limited to this. For example, the main signal port 420 may be installed on the seat shell 100. A second terminal 401 is provided in each main signal port 420. Each main signal port 420 is formed with channels 421 which are orthogonally connected with each other. The seat shell 100 is formed with wiring holes 101 correspondingly communicating with the channels 421 for inserting wires 10 into the channels 421 through the wiring holes 101 to electrically connect the main signal ports 420. Preferably, one of the channels 421 may be provided with a fastener 110 to tightly connect the wire 10 with the main signal port 420. A conductive element 430 is connected between the pair of elastic beam terminals 431. In this embodiment, the conductive element 430 and the pair of elastic beam terminals 431 are formed by a single metal sheet, but not limited to this. For example, the conductive element 430 may be another metal sheet connected to the elastic beam terminal 431 by soldering, riveting or screwing. Also, the conductive element 430 may be a wire or a printed circuit, etc. Thus, the elastic beam terminal 431 is not limited to disposing on the insulative element 410 jointly with the conductive element 430. In this embodiment, the conductive element 430 is embedded in the insulative element 410 and each of the pair of elastic beam terminals 431 is extended from the conductive element 430 to pass out of the insulative element 410. Each of the pair of elastic beam terminals 431 is movably arranged between one of the main signal ports 420 and the seat shell 100 and the elastic beam terminals 431 press to connect the respective main signal ports 420. In detail, the insulative element 410 is formed with a pair of operating passages 411, each of which extends from the insulative element 410 to one of the main signal ports 420. The exposed portion of the main signal port 420 is used for pressing a corresponding one of the elastic beam terminals 431. The respective elastic beam terminals 431 extend to pass the respective corresponding operating passages 411 and can sway in the respective corresponding operating passages 411. The respective pushing rods 440 can longitudinally move to be in contact with the pair of elastic beam terminals 431. In this embodiment, the pushing rods 440 are disposed on the respective insulative element 410 and longitudinally moveable corresponding to the respective elastic beam terminals 431. In detail, each pushing rod 440 penetrates the insulative element 410, but is not limited to this. For example, the pushing rod 440 may be fixed on the splitter board 310 correspondingly to the pair of elastic beam terminals 431. When the seat shell 100 and the cover shell 200 are closed, the pushing rod 440 can push the pair of elastic beam terminals 431 away from the main signal ports 420 to touch the ferrite elements 450.

The splitter board 310 is fixed in the cover shell 200. The splitting signal ports are provided outside the cover shell 200 and respectively penetrate the cover shell 200 to electrically connect with the splitter board 310. The pair of first terminals 301 is disposed on the splitter board 310 and extends backward to the internal surface of the cover shell 200. The first terminals 301 correspondingly connect with the second terminals 401 in the main signal ports 420.

In this embodiment, each of the first terminals 301 is of a cylindrical shape and each of the second terminals 401 is of a tubular shape corresponding thereto so as to make the former axially connect with the latter. Each second terminal 401 has claws 402 for correspondingly holding the first terminals 301, but is not limited to this. For example, the first terminal 301 may be of a tubular shape and each of the second terminals 401 of a cylindrical shape corresponding thereto.

When the cover shell 200 and the seat shell 100 are closed, the splitter board 310 presses the pushing rods 440 to push the elastic beam terminals 431 away from the main signal ports 420 to touch the ferrite elements 450. When the cover shell 200 is removed from the seat shell 100, the elastic beam terminals 431 restore elastically to connect with the main signal ports 420. Each of the elastic beam terminals 431 is bent to be in the shape of an S-shaped structure 432. A protrusion on a side of the S-shaped structure 432 is used to connect a corresponding one of the main signal ports 420, and a protrusion on another side of the S-shaped structure 432 is used to connect a corresponding one of the ferrite elements 450.

In the uninterruptible video splitter of the invention, when the cover shell 200 and the seat shell 100 are closed, the splitter board 310 presses the pushing rods 440 to push the elastic beam terminals 431 away from the main signal ports 420 to touch the ferrite elements 450. The high frequency property of the splitter board 310 will not be affected because the ferrite elements 450 reduce the resonant frequency of the elastic beam terminals 431.

It will be appreciated by persons skilled in the art that the above embodiments have been described by way of example only and not in any limitative sense, and that various alterations and modifications are possible without departure from the scope of the invention as defined by the appended claims.

What is claimed is:

1. An uninterruptible video splitter comprising:
a housing having a seat shell and a cover shell hermetically combining with the seat shell, wherein a pair of main signal ports is provided in the seat shell, at least part of the main signal ports is out of contact with the seat shell, a pair of pushing rods is provided in the housing, an insulative element, a pair of elastic beam terminals and a conductive element are provided in the seat shell, the conductive element is disposed in the insulative element to isolate from the housing, the conductive element connects with the pair of elastic beam terminals to make electric connection, each of the pair of elastic beam terminals is separately movably arranged between one of the main signal ports and the seat shell, an internal surface of the seat shell is provided with magnetic elements separately corresponding to the elastic beam terminals, a splitter board is disposed in the cover shell, the splitter board is provided with a pair of first terminals correspondingly connecting with second terminals in the main signal ports, splitting signal ports electrically connecting with the splitter board are provided outside the cover shell, each of the elastic beam terminals presses one of the main signal ports when the cover shell is removed from the seat shell, and the pushing rods push the elastic beam terminals away from the respective main signal ports to touch the magnetic elements when the cover shell is closed to seat shell, wherein each elastic beam terminal is inserted into a gap between the corresponding main signal port and the magnetic element so as to move between the corresponding main signal port and the magnetic element, wherein each magnetic element is of a plate shape, wherein when the cover shell covers and closes the seat shell, each elastic beam terminal is contacted with the corresponding magnetic element and separated from the seat shell by the magnetic element.

2. The uninterruptible video splitter of claim 1, wherein the pair of elastic beam terminals is disposed on the insulative element.

3. The uninterruptible video splitter of claim 2, wherein the pair of main signal ports are embedded in the insulative element, and part of each main signal port is exposed for being pressed by one elastic beam terminal.

4. The uninterruptible video splitter of claim 2, wherein each of the pushing rods is disposed on the insulative element to be longitudinally movable and penetrates the insulative element.

5. The uninterruptible video splitter of claim 1, wherein each main signal port is formed with channels which are orthogonally connected with each other.

6. The uninterruptible video splitter of claim 5, wherein the seat shell is formed with wiring holes correspondingly communicating with the channels.

7. The uninterruptible video splitter of claim 1, wherein the conductive element is embedded in the insulative element, and each of the elastic beam terminals extends from the conductive element to pass out of the insulative element.

8. The uninterruptible video splitter of claim 1, wherein the pair of elastic beam terminals and the conductive element are formed by a single metal sheet.

9. The uninterruptible video splitter of claim 1, wherein each of the elastic beam terminals is bent to be of an S-shaped structure, a protrusion on a side of the S-shaped structure is used to connect a corresponding one of the main signal ports, and a protrusion on another side of the S-shaped structure is used to connect a corresponding one of the magnetic elements.

* * * * *